United States Patent
Smith et al.

(10) Patent No.: US 6,507,081 B2
(45) Date of Patent: Jan. 14, 2003

(54) IN-SITU SILICON NITRIDE AND SILICON BASED OXIDE DEPOSITION WITH GRADED INTERFACE FOR DAMASCENE APPLICATION

(75) Inventors: Preston Smith; Chi-hing Choi, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/803,232

(22) Filed: Mar. 9, 2001

(65) Prior Publication Data

US 2001/0019175 A1 Sep. 6, 2001

Related U.S. Application Data

(62) Division of application No. 09/223,197, filed on Dec. 30, 1998, now Pat. No. 6,255,233.

(51) Int. Cl.[7] .......................... H01L 23/48; H01L 23/52
(52) U.S. Cl. ...................... 257/410; 257/774; 257/775
(58) Field of Search ........................ 257/401, 774, 257/775

(56) References Cited

U.S. PATENT DOCUMENTS

| | | | |
|---|---|---|---|
| 4,649,088 A | | 3/1987 | Mitsui et al. |
| 5,418,019 A | | 5/1995 | Chen et al. |
| 5,616,401 A | * | 4/1997 | Kobayashi et al. |
| 5,629,043 A | * | 5/1997 | Inaba et al. |
| 5,753,564 A | | 5/1998 | Fukada |
| 5,795,823 A | | 8/1998 | Avanzino et al. |
| 5,960,306 A | | 9/1999 | Hall et al. |
| 5,968,842 A | * | 10/1999 | Hsiao |
| 6,008,084 A | | 12/1999 | Sung |
| 6,008,873 A | | 12/1999 | Den Boer et al. |
| 6,010,962 A | | 1/2000 | Liu et al. |
| 6,013,581 A | | 1/2000 | Wu et al. |
| 6,029,602 A | | 2/2000 | Bhatnagar |
| 6,037,664 A | | 3/2000 | Zhao et al. |
| 6,171,978 B1 | * | 1/2001 | Lin et al. |
| 6,204,182 B1 | * | 3/2001 | Truninger et al. |
| 6,255,233 B1 | | 7/2001 | Smith et al. |
| 6,287,962 B1 | * | 9/2001 | Lin |

FOREIGN PATENT DOCUMENTS

| | | | |
|---|---|---|---|
| WO | WO 83/02199 A1 | | 6/1983 |
| WO | WO 83/02199 | * | 6/1983 |

* cited by examiner

*Primary Examiner*—Stephen D. Meier
(74) *Attorney, Agent, or Firm*—Blakely, Sokoloff, Taylor & Zafman LLP

(57) ABSTRACT

A structure to enable damascene copper semiconductor fabrication is disclosed. There is a silicon nitride film for providing a diffusion barrier for Cu as well as an etch stop for the duel damascene process. Directly above the silicon nitride film is a silicon oxynitride film. The silicon oxynitride film is graded, to form a gradual change in composition of nitrogen and oxygen within the film. Directly above the silicon oxynitride film is silicon oxide. The silicon oxide serves as an insulator for metal lines. Preferably, the film stack of silicon nitride, silicon oxynitride and silicon oxide is all formed in sequence, within the same plasma-processing chamber, by modifying the composition of film-forming gases for forming each film.

21 Claims, 2 Drawing Sheets

IN-SITU SILICON NITRIDE AND SILICON BASED OXIDE DEPOSITION WITH GRADED INTERFACE FOR DAMASCENE APPLICATION

This is a divisional of U.S. patent application Ser. No. 09/223,197, filed on Dec. 30, 1998 now U.S. Pat. No. 6,255,233.

FIELD OF THE INVENTION

The present invention is useful in the field of semiconductor processing. More specifically, the present invention discloses a method of depositing materials onto a substrate.

BACKGROUND

Semiconductor devices contain transistor elements and conductive lines of metal integrated with one another on a semiconductor substrate. In terms of location, the transistor elements are at the bottom of the device, so that they may be in direct contact with the underlying semiconductor substrate. Metal contacts electrically couple the transistor elements with the first level of metallization. Metal vias electrically couple the metal layers to one another. A dielectric thin film insulates the metal layers. The insulator exists between metallization layers, as well as surrounding the contacts and vias.

A semiconductor device is manufactured sequentially where one film is fabricated at a time. The sequence generally includes depositing a thin film material, patterning the material using photolithography and plasma etching, and then depositing another thin film material on the patterned material. There may be planarization steps in between the deposition steps, to reduce topographical effects that can limit photolithography and etching.

The metallization sequence of fabrication is usually as follows. A layer of silicon oxide is deposited on the substrate. The substrate may be the transistor elements or an underlying layer of metallization. Openings are formed in the silicon oxide. These openings are usually shaped as holes. The openings are filled with a conductor metal, usually aluminum or tungsten to form contacts or vias, as the case may be. Excess metal is removed from the surface and the surface is planarized. Then, a metallization material is deposited on the planarized silicon oxide containing contact or via plugs, usually this is aluminum. The aluminum is patterned using plasma etching to form electrically conductive lines that are coupled to the underlying metal or transistor elements through vias or contacts. Then, the patterned aluminum lines are covered with silicon oxide. Then, openings are formed in the silicon oxide, and the openings are filled with metal to create vias. The sequence is repeated until the desired number of metallization layers is attained.

In a semiconductor manufacturing method known as "damascene", a layer of silicon oxide is deposited on a substrate surface, and openings are formed in the silicon oxide to create a trench pattern in the shape of metal lines. Then, metal is deposited into the trenches of the pattern. The metal may be planarized to remove excess from the top surface of the silicon oxide. The result is a series of metal lines surrounded by silicon oxide, but it is achieved by depositing the metal into trenches in the silicon oxide, as opposed to depositing a blanket layer of metal and patterning it to form lines.

As the trend in semiconductor fabrication moves toward using copper as the conductive metal, it is desirable to use damascene, which avoids etching metal, because of technical problems with plasma etching copper. A limitation to the damascene process, however, is that it is difficult to properly endpoint the silicon oxide etch. This is because, the silicon oxide not only serves as the filler material around the metal lines, it also serves as insulation between metallization layers. Thus, a portion of the silicon oxide resides below the level on which to place the metal lines. It is evident, then, that when the silicon oxide must be etched, endpointing is difficult because it must be etched to enough depth to expose underlying vias, but in places where there are no vias to expose, the etch simply must be stopped to a measured depth. Simply stopping an etch to a measured depth can be done at a designated point on a substrate, but difficulties arise when the etch stop must be done uniformly across the substrate.

To address the etch stop problem with damascene, it is desirable to utilize an etch stop film, so that when the etch stop film is reached, the selectivity of the etch process favoring the silicon oxide will enable etch endpointing to be done more uniformly across the substrate. The etch stop film must also have insulative properties. A proposed etch stop film is silicon nitride.

Silicon nitride and silicon oxide are both formed using chemical vapor deposition. Each is traditionally formed in separate processing chambers. A sequence for forming the films may be to insert a substrate into a silicon nitride process chamber, deposit the silicon nitride, remove the substrate, insert the substrate into a silicon oxide chamber, and form the silicon oxide. There is an obvious downside to using two separate chambers which is that, when the substrate is removed from the silicon nitride process chamber, contamination could form on the film. The contamination could inhibit the formation of chemical bonds and result in adhesion problems when the silicon oxide is formed on the silicon nitride. Another problem with using two separate processing chambers is simply added process time from maneuvering the substrate from one processing chamber to another. Another problem with using silicon nitride and silicon oxide as a stack is the abruptness of the nitrogen content and oxygen content of the films at the film interface. An abrupt interface leads to adhesion problems for the silicon oxide due to large interfacial stresses.

It would be advantageous to avoid the contamination, extra processing time, and adhesion problems when utilizing a stacked dielectric film of silicon nitride and silicon oxide as the insulator in semiconductor devices.

SUMMARY OF THE INVENTION

The invention discloses a process for forming a silicon oxide film over silicon nitride on a substrate. A substrate is placed within a plasma processing chamber, and a silicon nitride film is deposited thereon. Then, the silicon oxide film is formed within the same plasma process chamber.

In a further aspect of the invention, a novel semiconductor device is disclosed. There is a substrate, on which there is a layer of silicon nitride. There is a layer of graded silicon oxynitride on the silicon nitride. A layer of silicon oxide is on the graded silicon oxynitride.

BRIEF DESCRIPTION OF THE DRAWINGS

Drawings are provided to further illustrate details of the disclosure below. The drawings do not limit the scope of the invention to the features shown. The features are not drawn to scale.

DETAILED DESCRIPTION OF THE PREFERRED EMBODIMENTS

Disclosed is a method of formation of a stacked film of silicon nitride and silicon oxide. The two films are preferably formed within the same plasma processing chamber. In another aspect, the two films contain a silicon oxynitride layer between the two films, where the oxygen percentage in the silicon oxynitride is graded to avoid an abrupt silicon nitride and silicon oxide interface. The invention will be described first in terms of the stacked film structure. Then, a method of forming the stacked film will be described. Any reference to dimensions are purely for illustrative purposes, and are determined by the design rules of a particular semiconductor device. Any reference to "approximate" or like term, should be construed as a target manufacturing specification, plus or minus variation within reasonable manufacturing tolerances, unless otherwise specified. The detailed description will refer to silicon oxide, but it should be construed very generically, so that silicon oxide includes any oxides of silicon in varying compositions, and various additives that may be used. For example, a "silicon oxide" film may actually be fluorinated silicon oxide. The context of the description will be in semiconductor processing, and more specifically, in the use of copper for metallization in a damascene process. Although the context is copper damascene process, the invention is not limited to that context in any way. Nor is the invention limited to semiconductor devices or semiconductor processing. A person of ordinary skill in the art is expected to apply the invention to various contexts as reasonably can be expected of a person of such skill; the description below should not be construed to limit the scope of the invention to the aspects described.

Figure 1:
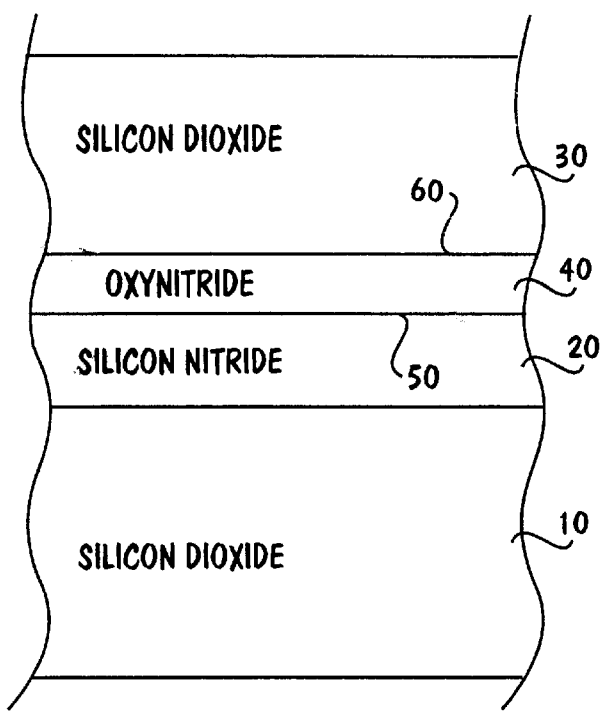
FIG. 1 is a cross-sectional view illustrating a silicon nitride film, a graded silicon oxynitride film thereon, and a silicon oxide film thereon.

FIG. 1 illustrates in cross-section, a preferred embodiment of the stacked silicon nitride and silicon oxide film. There is a substrate 10, which may be a silicon wafer or a silicon wafer with silicon oxide deposited on top of the wafer. A silicon nitride film 20 is formed on substrate 10. Silicon nitride film 20 may be approximately 100 angstroms to 2000 angstroms in thickness. A silicon oxide film 30 is held a distance above silicon nitride film 20. Silicon oxide film 30 may be approximately 5000 angstroms to 3 microns in thickness. A layer of graded silicon oxynitride 40 separates silicon nitride film 20 from silicon oxide film 30. Silicon oxynitride 40 may be approximately 300 to 2000 angstroms thick. The percentage of oxygen is graded in silicon oxynitride 40 so that the bottom of silicon oxynitride 40 at the silicon nitride interface 50 contains approximately zero percentage of oxygen. The top of silicon oxynitride 40 at the silicon oxide interface 60 contains an oxygen composition that is approximately 50 to 70% oxygen, preferably approximately 60% oxygen. The minimum thickness of silicon oxynitride 40 is determined by the desired oxygen and nitrogen concentration gradients. The amount of oxygen in silicon oxynitride 40 can be measured in estimate using depth profile SIMS or similar technique. Because in semiconductor manufacturing it is advantageous to minimize processing time, the maximum thickness of silicon oxynitride 40 is preferably determined by the minimum thickness required for the desired concentration profiles plus added thickness for manufacturing tolerances including film thickness uniformity across substrate 10.

Figure 2:
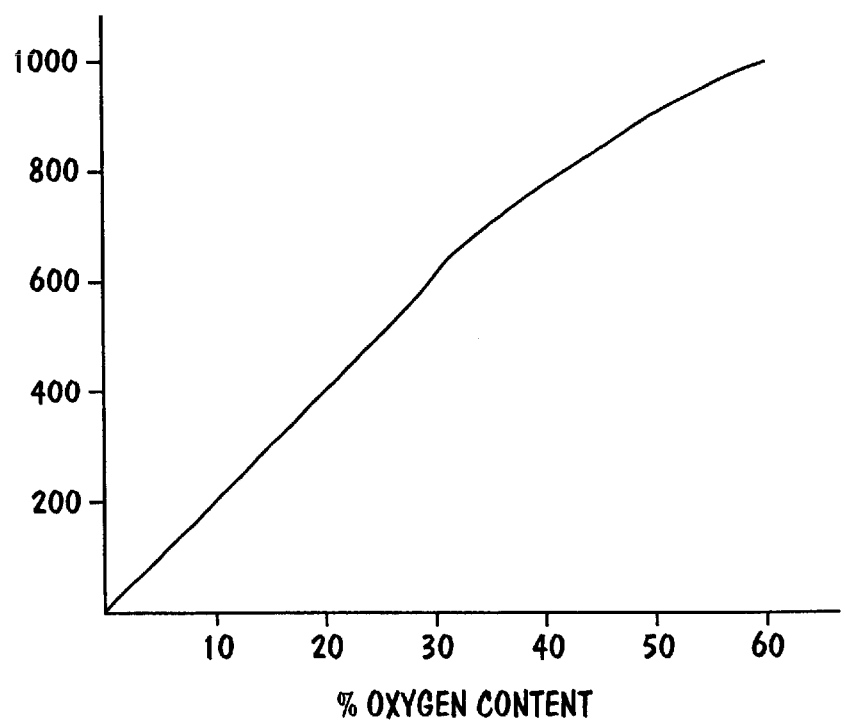
FIG. 2 is a graph illustrating the silicon nitride to silicon oxide gradation.

FIG. 2 shows a graphical description of the gradation of oxygen in silicon oxynitride 40 of FIG. 1. At approximately zero film thickness, the oxygen percentage is about zero. At approximately 500 to 1000 angstroms distance from silicon nitride, the oxygen percentage is about 60%. Note that varying the process for forming silicon oxynitride 40 can vary the composition of oxygen with respect to film thickness. A description of a process is provided further below.

Figure 3:
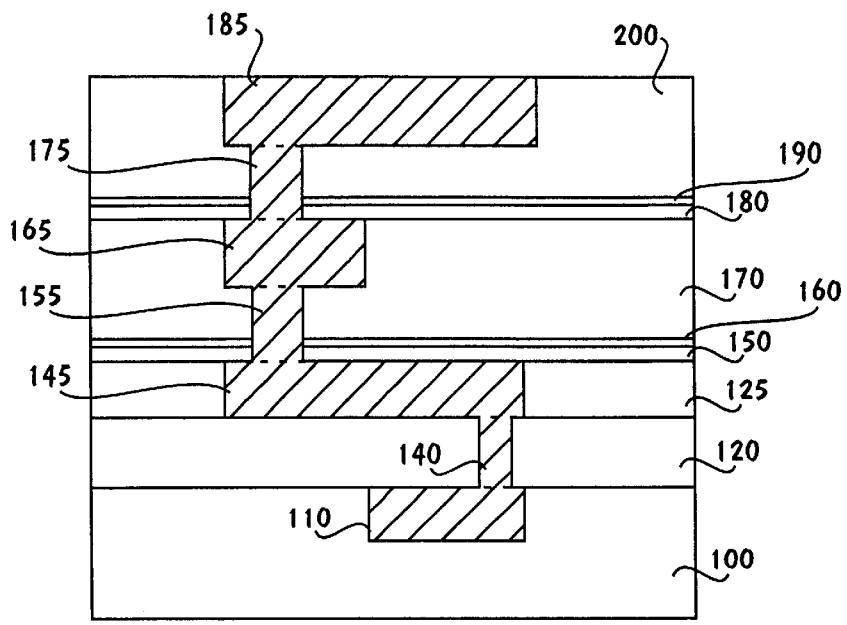
FIG. 3 is a cross-sectional view illustrating a semiconductor device having a silicon nitride film, a graded silicon oxynitride film, and a silicon oxide film.

FIG. 3 shows in cross section an application of the present invention to a copper metallization semiconductor. device. There is a semiconductor wafer substrate 100. Transistor structures 110 are built on substrate 100. A first dielectric layer 120 is disposed above transistor structures 110. First dielectric layer 120 may be silicon oxide, at a thickness of approximately 1 to 2 microns. First dielectric layer 120 may be deposited over transistor structures using a chemical vapor deposition, to create a blanket layer of first dielectric 120. Contact holes 140 within first dielectric 120 are filled with a metal such as tungsten, aluminum or copper, to enable electrical interconnection between transistor structures 110 and electrical wiring above the device. Contact holes 140 may be created in first dielectric layer 120 by plasma etching a hole pattern into first dielectric layer 120, and filling the pattern with the desired metal using vapor deposition techniques.

Directly above first dielectric layer 120 containing filled contact holes 140, there is a second dielectric layer 125. Second dielectric layer 125 surrounds a first metallization 145. Second dielectric layer 125 may be a fluorinated silicon oxide, so that the dielectric constant of the film is lower than that of pure silicon dioxide. First metallization 145 may be made of copper, and is patterned in a series of lines for forming a first wiring plane in the semiconductor device. First metallization 145 is formed by opening a pattern in second dielectric layer 125 by plasma etching, and then filling the openings in the pattern with copper or other preferred metal, and then planarizing the surface to remove any excess metal. This "single damascene" technique effectively fills contact holes 140 with the desired metal. First metallization 145 and second dielectric 125 may be approximately 5000 angstroms to 1 micron in thickness.

The next series of films is a silicon nitride/silicon oxynitride/silicon oxide stack. There is a first silicon nitride etch stop 150 that is directly above the surface of second dielectric 125 and first metallization 145. Directly above the surface of first silicon nitride 150 is a first graded silicon oxynitride 160. Directly above the surface of first graded silicon oxynitride 160 is a third dielectric layer 170, which may be a fluorinated silicon oxide ("SiOF") also referred to as first SiOF so that the dielectric constant of third dielectric layer 170 is lower than that of pure silicon dioxide. First silicon nitride 150 is formed directly over second dielectric 125 and first metallization 145 preferably by vapor deposition, to a thickness of approximately 40 nanometers to 500 nanometers, or 400 angstroms to 5000 angstroms. It is important to make first silicon nitride 150 as thin as possible within manufacturing feasibility to avoid dielectric constant increase effects. First graded silicon oxynitride 160 is preferably formed using vapor deposition, within the same processing chamber used for forming first silicon nitride 150, by combining the process gases used for forming first silicon nitride 150 and SiOF 170. First graded silicon oxynitride 160 is preferably a thickness of approximately 300 to 2000 angstroms. SiOF 170 is preferably formed using vapor deposition, within the same processing chamber used for forming first silicon nitride 150 and graded silicon oxynitride 160, to a thickness of approximately 5000 angstroms to 3 microns.

Within the plane of SiOF 170 there is a dual structure of a first via 155 and a second metallization 165. First via 155 is formed by etching a hole at a first dimension within SiOF 170, and, while forming a larger opening at a second dimension within SiOF 170 to create the space for second metallization 165, extending the hole at the first dimension through the thickness of SiOF 170, first graded silicon oxynitride 160 and first silicon nitride 150 so that the hole extends to first metallization 145. First via 155 is in direct metal-to-metal contact with first metallization 145. Second metallization 165 is formed by etching line patterns into SiOF 170, preferably in-situ with cutting the hole for first via 155 as explained above. The line patterns for second metallization 165 are aligned with the hole patterns for first via 155 to enable direct metal-to-metal contact between first via 155 and second metallization 165. After creating the hole openings and line openings within the stack of SiOF 170, first silicon oxynitride 160 and first silicon nitride 150, first via 155 and second metallization 165 are completed by filling the openings with copper or other desired electrically conductive material, utilizing a vapor deposition process.

The next structure layer of the semiconductor device may be similar to the above. There is a second silicon nitride 180, formed directly above the surface of SiOF 170 and second metallization 165. Directly above the surface of second silicon nitride 180 is a second graded silicon oxynitride 190. Directly above the surface of second graded silicon oxynitride 190 is a fourth dielectric layer 200, also referred to as second SiOF 200, so that the dielectric constant of second SiOF 200 is lower than that of pure silicon dioxide. Second silicon nitride 180 is formed preferably by vapor deposition, to a thickness of approximately 40 nanometers to 500 nanometers, or 400 angstroms to 5000 angstroms. It is important to make second silicon nitride 180 as thin as possible within manufacturing feasibility to avoid dielectric constant increase effects. Second graded silicon oxynitride 190 is preferably formed using vapor deposition, within the same processing chamber used for forming second silicon nitride 180, by combining the process gases used for forming second silicon nitride 180 and second SiOF 200. Second graded silicon oxynitride 190 is preferably a thickness of approximately 300 to 2000 angstroms. Second SiOF 200 is preferably formed using vapor deposition, within the same processing chamber used for forming second silicon nitride 180 and second graded silicon oxynitride 190, to a thickness of approximately 5000 angstroms to 3 microns.

Within the plane of second SiOF 200 there is a dual structure of a second via 175 and a third metallization 185. Second via 175 is formed by etching a hole within second SiOF 200, and, while forming a larger opening within second SiOF 200 to create the third metallization 185, extending the hole through the thickness of second SiOF 200, second graded silicon oxynitride 190 and second silicon nitride 180 so that the hole extends to second metallization 165. Second via 175 is in direct metal-to-metal contact with second metallization 165. Third metallization 185 is formed as explained above, by etching line patterns into second SiOF 200, preferably in-situ with cutting the hole for second via 175. The line patterns for third metallization 185 are aligned with the hole patterns for second via 175 to enable direct metal-to-metal contact between second via 175 and third metallization 185. After creating the hole openings and line openings within the stack of second silicon nitride 180, second silicon oxynitride 190 and second SiOF 200, second via 175 and third metallization 185 are completed by filling the openings with copper or other desired electrically conductive material, utilizing a vapor deposition process.

Figure 4:
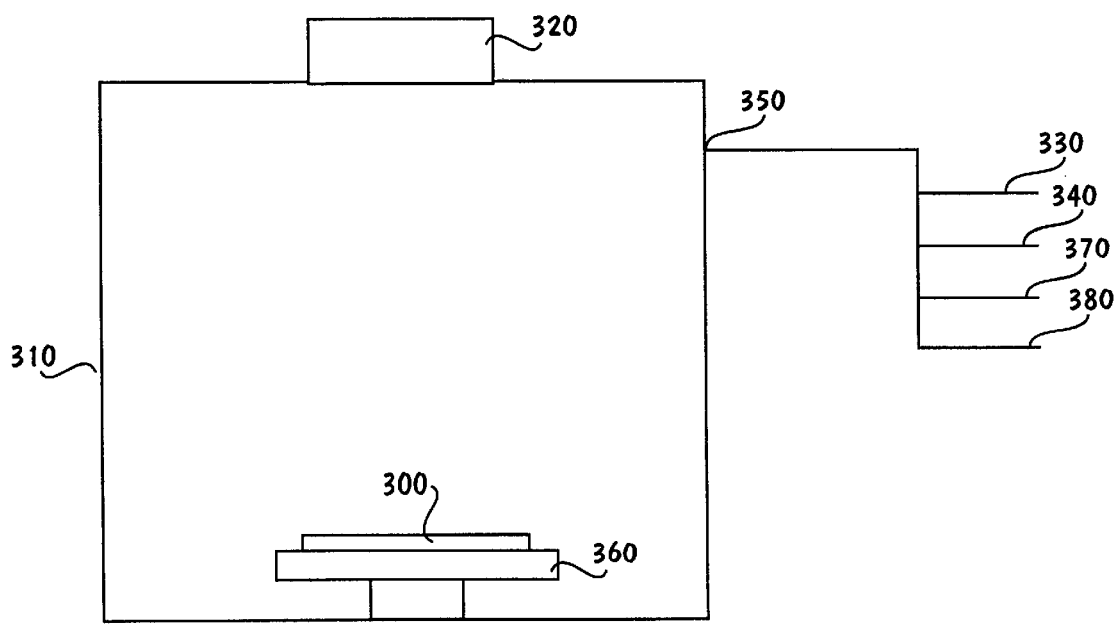
FIG. 4 is an illustration of a side view of the interior or a plasma processing chamber where the three films, silicon nitride, silicon oxynitride and silicon oxide, may be formed.

The process for forming the stacked silicon nitride and silicon oxide film can be carried out in a commercial chemical vapor deposition chamber. An example process is described in reference to FIG. 4. Substrate 300 is placed within a plasma processing chamber 310. The preferred plasma processing chamber utilizes microwave frequency source 320 for forming plasma in an electron cyclotron resonance. Other sources of plasma such as inductive coupling can be used. The processing chamber 310 is pumped down to a minimum pressure for processing chamber 310.

Then, silicon nitride-forming gases are introduced, preferably these are silane ($SiH_4$) 330 and nitrogen ($N_2$) gas 340. The gases flow through an inlet 350 (ammonia may be used if the system is not a high density plasma system capable of dissociating diatomic nitrogen). The gas flow rates depend on the size of the processing chamber 310 and the size of the substrate 300; an example of a total gas flow rate may be approximately 80 standard cubic centimeters per minute (sccm) to 200 sccm. A ratio of approximately ¼ to ½ of $SiH_4$ to $N_2$ may be used. The temperature of substrate 300 is regulated at approximately 375 to 450 degrees celsius. The substrate temperature is regulated by securing the substrate 300 against a helium-cooled chuck 360 preferably by electrostatic force or a mechanical clamp. The plasma is formed by applying a microwave frequency to the process gases, at a power level of approximately 450 to 750 watts. Substrate 300 may be biased using radio frequency at about 3000 watts. The various process parameters may be adjusted to achieve a desired refractive index and deposition rate for the silicon nitride. Silicon nitride is formed to a desired thickness.

Next, a graded silicon oxynitride is formed. Without modifying the electrical or thermal parameters described above, the flowrate of the gases used for forming silicon nitride is reduced by approximately one half, and gases for forming SiOF (since it can be desirable to use SiOF in lieu of pure silicon dioxide) are added to the mixture, for an example total gas flow rate of approximately 130 to 250 sccm. Such gases for forming SiOF may be silicon tetrafluoride ($SiF_4$) 370 and oxygen ($O_2$) 380. $SiF_4$ 370 may be approximately 10 to 20% of the total gas flow, and $O_2$ 380 may be approximately 50 to 75% of the total gas flow, and the ratio of $SiH_4$ 330 to $N_2$ 340 remain approximately the same as for depositing silicon nitride. Silicon oxynitride is formed to a desired thickness.

Next, without removing substrate 300 from processing chamber 310, the SiOF is formed. The flow rates of $SiF_4$ 370 and $O_2$ 380 from the previous step are approximately doubled, and $SiH_4$ 330 is preferably turned off. $N_2$ 340 may remain on but preferably at a flowrate reduced by 75 to 50% from the previous step, for an example total gas flow rate of approximately 200 to 300 sccm. Power levels for substrate bias and microwave power may be adjusted to obtain the desired refractive index and deposition rate for silicon oxide. When the desired amount of silicon oxide is formed, the plasma is turned off, and substrate 330 is removed from process chamber 310.

A process has been described for forming a silicon nitride, silicon oxynitride and SiOF films all within the same plasma processing chamber. Forming a stacked silicon nitride and silicon oxide film structure in the same chamber has the advantage of avoiding contamination to the silicon nitride surface that may result if the substrate is removed from the processing chamber and inserted into a separate chamber for forming the silicon oxide. Additionally, a graded silicon oxynitride can be formed by having a step in between the formation of silicon nitride and silicon oxide, where the gases for forming the two films are merged together. A graded silicon oxynitride is advantageous in that it helps the silicon oxide adhere to the silicon nitride by having a gradual, rather than abrupt, interface. While details have been provided on the process for formation of a silicon nitride, silicon oxynitride and silicon oxide stacked film, they are provided for an example in a semiconductor fabrication context only. Gas chemistries, power levels, bias, pressure, and temperature may differ depending on the processing chamber used, the type of plasma that is formed, the size or type of substrate, and the desired refractive indices and deposition rates. Other details that may have not been provided may be obtained by experimentation by a person of ordinary skill in the art. While particulars of the structure and process have been provided here, such details should not be construed to limit the present invention in any way, as the invention is limited only by the claims below.

We claim:

1. A semiconductor device, comprising:
   a substrate;
   a layer of silicon nitride on the substrate;
   a layer of graded silicon oxynitride on the silicon nitride; and
   a layer of silicon oxide on the graded silicon oxynitride.

2. A semiconductor device as in claim 1, further including metal portions filling openings within the silicon nitride, the graded silicon oxynitride and the silicon oxide.

3. A semiconductor device as in claim 2, wherein the metal includes copper.

4. A metallization semiconductor device, comprising:
   a semiconductor wafer substrate;
   a transistor structure disposed on the substrate;
   a first dielectric layer disposed above the transistor structure;
   a metal-filled contact hole in the first dielectric layer;
   a second dielectric layer disposed directly above the first dielectric layer;
   a first metallization surrounded by the second dielectric layer;
   an etch stop disposed directly above the second dielectric layer and the first metallization;
   a first layer of graded silicon oxynitride disposed on the etch stop; and
   a third dielectric layer disposed on the first layer of graded silicon oxynitride.

5. The metallization semiconductor device as in claim 4, wherein the first etch stop is a silicon nitride film in a thickness range from about 400 Angstroms to about 5,000 Angstroms.

6. The metallization semiconductor device as in claim 4, wherein the first layer of graded silicon oxynitride has a thickness in a range from about 300 Angstroms to about 2,000 Angstroms.

7. The metallization semiconductor device as in claim 4, wherein the first layer of graded silicon oxynitride contains about zero percentage of oxygen at an interface with the first etch stop.

8. The metallization semiconductor device as in claim 4, wherein the first layer of graded silicon oxynitride contains oxygen at an interface with the third dielectric layer in a range from about 50% to about 70%.

9. The metallization semiconductor device as in claim 4, wherein the first layer of graded silicon oxynitride contains oxygen at an interface with the third dielectric layer of about 60%.

10. The metallization semiconductor device as in claim 4, wherein the first dielectric layer comprises silicon oxide in a thickness from about 1 micron to about 2 microns.

11. The metallization semiconductor device as in claim 4, wherein the a metal-filled contact hole in the first dielectric layer comprises a metal selected from tungsten, aluminum, or copper.

12. The metallization semiconductor device as in claim 4, wherein the second dielectric layer comprises fluorinated silicon oxide.

13. The metallization semiconductor device as in claim 4, wherein the second dielectric layer has a thickness in a range from about 5,000 Angstroms to about 1 micron.

14. The metallization semiconductor device as in claim 4, wherein the third dielectric layer comprises fluorinated silicon oxide.

15. The metallization semiconductor device as in claim 4, wherein the first layer of graded silicon oxynitride is in a thickness range from about 300 Angstroms to about 2,000 Angstroms.

16. The metallization semiconductor device as in claim 4, wherein the third dielectric layer is in a thickness range from about 5,000 Angstroms to about 3 microns.

17. The metallization semiconductor device as in claim 4, further comprising:
   a second metallization surrounded by the third dielectric layer;
   a second etch stop disposed directly above the third dielectric layer;
   a second graded silicon oxynitride layer disposed directly above the second etch stop;
   a fourth dielectric layer disposed directly above the second graded silicon oxynitride layer; and
   a third metallization surrounded by the fourth dielectric layer.

18. The metallization semiconductor device as in claim 16, wherein the second etch stop is silicon nitride in a thickness range from about 400 Angstroms to about 5,000 Angstroms.

19. A stacked film comprising:
   a semiconductor wafer substrate;
   a transistor structure disposed on the substrate;
   a first dielectric layer disposed above the transistor structure;
   a metal-filled contact hole in the first dielectric layer;
   a second dielectric layer disposed directly above the first dielectric layer;
   a first metallization surrounded by the second dielectric layer;
   first silicon nitride etch stop disposed directly above the second dielectric layer and the first metallization;
   a first layer of graded silicon oxynitride disposed on the etch stop;
   a third dielectric layer disposed on the first layer of graded silicon oxynitride;
   a second metallization surrounded by the third dielectric layer;
   a second silicon nitride etch stop disposed directly above the third dielectric layer;
   a second graded silicon oxynitride layer disposed directly above the second etch stop;
   a fourth dielectric layer disposed directly above the second graded silicon oxynitride layer; and
   a third metallization surrounded by the fourth dielectric layer.

20. The stacked film as in claim 19, wherein the second dielectric layer has a dielectric constant that is lower than that of pure silicon dioxide.

21. The stacked film as in claim 4, wherein the third dielectric layer has a dielectric constant that is lower than that of pure silicon dioxide.

* * * * *